United States Patent [19]

Daur et al.

[11] 4,268,585

[45] May 19, 1981

[54] SOLDERING TO A GOLD MEMBER

[75] Inventors: Rolf Daur, Erbach; Herbert Hoffmann, Pfuhl; Günter Schmid, Senden, all of Fed. Rep. of Germany

[73] Assignee: Licentia Patent-Verwaltungs-G.m.b.H., Frankfurt am Main, Fed. Rep. of Germany

[21] Appl. No.: 911,307

[22] Filed: Jun. 1, 1978

[30] Foreign Application Priority Data

Jun. 1, 1977 [DE] Fed. Rep. of Germany ....... 2724641

[51] Int. Cl.³ .................. H05K 1/09; H05K 3/12; H05K 3/28; H05K 3/34
[52] U.S. Cl. .................. 428/622; 174/68.5; 228/180 R; 228/180 A; 228/263 R; 427/96; 427/125; 427/374.4; 427/376.8; 427/404; 428/209; 428/672; 428/901; 428/621; 428/624; 428/647
[58] Field of Search ............ 427/96, 125, 376 E, 427/376 G, 383 R, 404; 174/68.5; 228/180 R, 180 A, 263; 428/209, 901, 672, 622, 621, 624, 647, 645

[56] References Cited

U.S. PATENT DOCUMENTS

| | | | |
|---|---|---|---|
| 2,220,961 | 11/1940 | Kern | 228/263 |
| 3,160,798 | 12/1964 | Lootens | 228/263 |
| 3,205,297 | 9/1965 | Brock | 174/68.5 |
| 3,207,838 | 9/1965 | McCormack | 174/68.5 |
| 3,209,450 | 10/1965 | Klein | 228/208 |
| 3,472,653 | 10/1969 | Short | 228/263 |
| 3,583,063 | 6/1971 | Growney | 228/180 |
| 3,645,785 | 2/1972 | Hentzschel | 428/672 |
| 3,660,632 | 5/1972 | Leinkram | 228/180 A |
| 3,716,907 | 2/1973 | Anderson | 228/180 A |
| 3,809,797 | 5/1974 | McMunn | 174/68.5 |
| 4,077,854 | 3/1978 | Estep | 427/96 |

FOREIGN PATENT DOCUMENTS 1587273  2/1970  France ................ 428/672

Primary Examiner—John D. Smith
Attorney, Agent, or Firm—Spencer & Kaye

[57] ABSTRACT

A method of applying solder to gold by applying a gold-tin intermediate layer to the gold and applying the solder over at least a portion of the intermediate layer. The method can be employed to produce a printed circuit unit composed of a printed circuit board, at least one gold member mounted on the board, a gold-tin intermediate layer bonded to at least a portion of the gold member, and solder bonded onto the intermediate layer.

20 Claims, 3 Drawing Figures

SOLDERING TO A GOLD MEMBER

BACKGROUND OF THE INVENTION

1. Field of the Invention

The invention relates to a method for applying solder to gold, and additionally relates to printed circuit boards having solder applied to gold members on the board by such method.

2. Description of the Prior Art

The current state of the art in electronics often necessitates applying solder to gold. The solder is used, for example, in soldering electrical components such as resistors, capacitors or the like to the gold conductors used in printed circuit boards.

However, due to the high solubility of gold in the tin component of conventional soft solders made of tin-lead, tin-silver, tin-lead-silver, tin-lead-copper, and the like, alloys, pretinned components or connecting leads attached to the components cannot be soldered to the gold conductors without the gold alloying or diffusing into the tin.

Previous attempts to overcome the problem have included using solders having high indium or extremely high lead contents. Yet, high indium solders have a low inherent mechanical strength as well as a reduced resistance to temperature. High lead solders containing extremely elevated levels of lead have also proven inadequate because of the high soldering temperatures which are necessary. These high temperatures may have the effect of damaging the components being soldered as well as enhancing oxidation of the components which become heated as a result of the soldering process.

SUMMARY OF THE INVENTION

It is, therefore, an object of the invention to provide a method of applying solder to gold in a manner in which the gold does not alloy into the solder even though conventional solder is used.

It is a further object of the invention to provide a soldering method which avoids the use of unduly high soldering temperatures while at the same time providing a bond exhibiting satisfactory mechanical and electrical integrity and strength.

It is yet a further object of the invention to provide a printed circuit board in which gold members are soldered with conventional solder without the gold becoming alloyed into the solder.

It is also an object of the invention to provide a printed circuit board in which various components are attached by means of solder to gold members in a manner exhibiting both mechanical and electrical integrity.

These and other objects are achieved by the soldering method and printed circuit board of the invention.

According to the method of the invention, solder is applied to gold by a method which includes applying a gold-tin intermediate layer to the gold and then applying the solder over at least a portion of the intermediate layer.

The solder used may be a soft solder, for example, selected from the group of solders made of tin-lead, tin-silver, tin-lead-silver, and tin-lead-copper alloys.

The printed circuit board of the invention is composed of a circuit board, at least one gold member mounted on the board, a gold-tin intermediate layer joined to at least a portion of the gold member, and solder joined to the intermediate layer.

DESCRIPTION OF THE PREFERRED EMBODIMENTS

Figure 1:
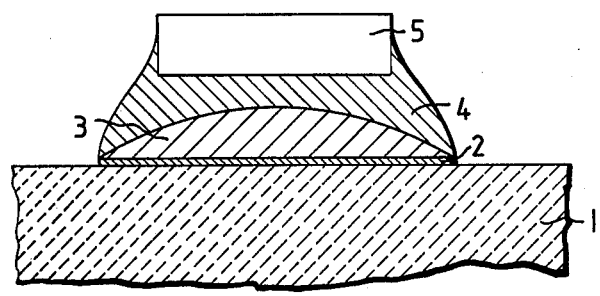
FIG. 1 is a cross-sectional view of a printed circuit board having a component soldered thereto according to a preferred embodiment of the invention.

According to the invention it is possible to achieve solder-gold electrical connections while at the same time avoiding the problems inherent in the prior art processes. This is accomplished, in the inventive process, by applying an intermediate layer of gold and tin to the gold surface to be soldered. Solder is then applied to the intermediate layer. During the subsequent soldering process the gold-tin intermediate layer acts both as an adhesion base as well as an alloying block. As was pointed out above, the use of soft solders is particularly preferred according to the invention, and the intended preferred soft solders are those solders having melting points up to 250° C. and which are normally based on alloys of tin and lead, tin and silver, tin, lead and silver, or tin, lead and copper.

The gold-tin intermediate layer is preferably made of a eutectic composition containing approximately 80% gold and about 20% tin although other composition ranges are possible from 75% gold/25% tin to 90% gold/10% tin.

To produce the intermediate layer, the gold-tin material is applied to the point at which soldering is to take place and is then heated and melted to form the intermediate layer. The gold-tin mixture may be applied in any number of ways to the gold material. The material may be applied in the form of a paste by a conventional screen printing or stamping process. Alternatively, metering of the material through a metering device, or application of a gold-tin foil may also be used. The above methods of application are particularly suitable when applying the gold-tin to gold conductors often used in printed circuit boards.

As was previously pointed out, in conventional processes where solder is applied directly to the gold there is a tendency for the gold to alloy into or diffuse into the soft solders conventionally used. The instant invention obviates this problem primarily by means of the gold-tin intermediate layer. Nevertheless as may be seen from FIG. 1, even with the present invention it may be possible for the gold material to come into contact with the superimposed soft solder layer, thus resulting in undesirable diffusion or alloying. Accordingly, a protective coating or layer may be applied to the areas surrounding the soft solder layer so as to prevent migration of the gold in contact with the soft solder. This protective layer is applied so as to overlap the edge region of the gold-tin intermediate layer before the soft soldering step. As may be seen in FIGS. 2 and 3, the protective layer is applied in a manner so as to prevent contact between the gold and soft solder layers. When soldering is to be performed onto a gold conductor located on a printed circuit board it is preferable to apply the coating over the entire surface of the substrate or board as well as over the thick or thin film circuit arrangement, with the exception of those points at which soldering or other processes such as bonding or gluing are to be performed.

The type of protective layer used is not critical, provided that it serves the function of preventing the alloying of the gold and the soft solder together with one another. As an example, protective organic materials may be used which are adequately resistive to heat and metal migration to serve the purposes of the protective layer. Once applied, the protective organic material may be selectively disposed so as to result in a layer which covers the entire circuit board or substrate with the exception of those areas where soldering, gluing or the like are subsequently to be performed.

By means of the present invention process it is possible to manufacture printed circuit boards using gold conductors. Since the resistance per unit area of the gold layers is only about one to two tenths of the resistance of conductors made of materials which can be directly soldered by means of conventional soft solders, narrower conductive paths may be used, which in turn results in savings of space, higher component density and savings with respect to materials which need be used. Furthermore, because of the better dissolution properties of gold pastes which may be applied in thinner strands, the conductor paths may be arranged more closely together which again results in a savings of materials.

The normally required overlap between the gold conductor paths and the soft-solderable conductive paths as well as the compatibility problems which are often encountered are obviated with the process and circuit board of the invention. Soldering, bonding and gluing therefore become practically possible alternatives for a single conductive path, thus substantially simplifying the choice and selection of usable components.

Additionally, the adhesion of the soft solder connections is increased by means of the inventive method while alloying problems between the gold and soft solder are substantially prevented. Since gold has only a minimal diffusion capability into the dielectric and resistance layers, the use of the invention makes it possible to obtain a significant improvement in the climate resistance and aging behavior of integrated layers of conductor path intersections, capacitors and thick film resistors. The high resistance of gold to electrochemical ion travel also serves to reduce passivation problems. Thus, with the use of suitable starting materials, gold layers may also be used to produce microwave circuit structures.

Turning now to the drawings, FIG. 1 presents a cross-sectional view of a substrate 1 having a gold layer 2 attached on the substrate. A gold-tin intermediate layer 3 separates a body of soft solder 4 from the gold layer and is bonded to a component 5 having an external or internal connecting element.

The gold layer 2 is applied to the substrate 1, which may be made of ceramic or glass, at temperatures of up to 1000° C., in the form of a pressed-on paste. Next, the gold-tin intermediate layer 3 is applied, as a paste by means of screen printing or stamping, or by means of a metering device, or as a shaped foil member, onto the portion of the gold layer or section to be soldered. The intermediate layer which preferably consists of 80% gold and 20% tin, is then melted in air or in an inert atmosphere at at temperature of about 310° C. to 330° C. This intermediate layer will serve as both an adhesive base and an alloying block for the soft solder which is subsequently to be applied. The thicker soft solder layer may next be applied by any of the methods discussed above in conjunction with the production of the intermediate layer. Preferably the soft solder has a composition selected from among: 62% tin, 36% lead, 2% silver, having a soldering, or melting, temperature of 210° C. to 230° C.; 63% tin, 37% lead having a soldering temperature of 215° C. to 235° C.; and 96.5% tin, and 3.5% silver with a soldering temperature of about 250° C.

The components themselves or their external or internal connecting leads 5, may be soldered during melting of the soft solder layer 4. Alternatively, the layer 4 may be remelted, if the initial melting had occurred earlier, in order to bond the component to the solder. Once again, the solder may be heated in air or an inert atmosphere. As shown, the soft solder layer 4 acts to mechanically and electrically connect the components and connecting leads 5 with the intermediate layer 3.

Figure 2:
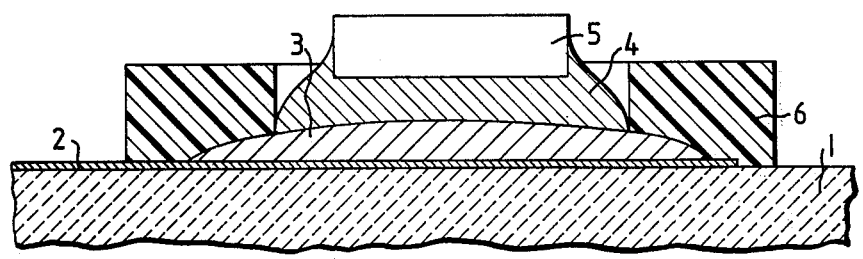
FIG. 2 is a cross-sectional view similar to that shown in FIG. 1 further comprising an organic based protective layer according to a second preferred embodiment of the invention.

FIG. 2 shows a solder joint according to the invention associated with an organic based protective layer 6 which has been applied by means of screen printing after application of intermediate layer 3 but prior to application of the soft solder so as to overlap the edge regions of the gold-tin intermediate layer 3 thus preventing overflow of the molten soft solder onto the gold conductor 2 and thus alloying away of the gold layer or the edges of the intermediate layer.

The overlapping zone of the organic based protective layer 6 which may consist either of phenolic resin or mineral filled silicon has to be dimensioned in a way which provides safe protection for the thinner edge zone of the gold-tin intermediate layer 3 preventing soft solder alloying or diffusing through the thinner edge zone onto the gold layer 2.

Figure 3:
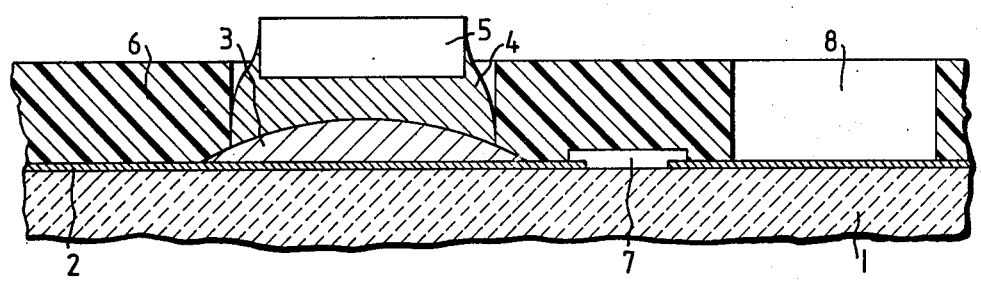
FIG. 3 is a cross-sectional view of a board such as that shown in FIG. 2 wherein the protective layer covers the entire surface of the board except for certain recesses.

FIG. 3 illustrates part of a printed circuit board in which an organic protective layer 6 has been applied to the entire surface of the substrate such that it entirely covers the thick or thin film circuit arrangements disposed on the circuit board substrate such as, for example, a film resistor 7, while nevertheless providing recesses 8 at the various locations on the substrate where soldering, gluing and bonding are to take place.

It will be understood that the above description of the present invention is susceptible to various modifications, changes and adaptations, and the same are intended to be comprehended within the meaning and range of equivalents of the appended claims.

What is claimed is:

1. A method of applying solder to a gold member which comprises the steps of:
   (a) joining an intermediate layer consisting of gold and tin to the surface of the gold member which functions to prevent the diffusion or alloying of the gold member into a subsequently applied soft solder; and
   (b) joining a soft solder to at least a portion of said intermediate layer.

2. A method as defined in claim 1, wherein said step of joining an intermediate layer is effected by screen printing a gold-tin paste onto the gold surface and subsequently melting the paste to form the intermediate layer.

3. A method as defined in claim 1 wherein said step of joining an intermediate layer to the gold surface is effected by stamping a gold-tin paste onto the gold surface and subsequently melting the paste to form the intermediate layer.

4. A method as defined in claim 1 wherein said step of joining an intermediate layer to the gold surface is effected by metering a molten gold-tin composition onto the gold surface through a metering device and melting the composition to form the intermediate layer.

5. A method as defined in claim 1 wherein said step of joining an intermediate layer to the gold surface is carried out by applying a shaped gold-tin foil to the gold surface and melting the foil to form the intermediate layer.

6. A method as defined in claim 1 wherein said soft solder has a composition selected from the group consisting of tin-lead, tin-silver, tin-lead-silver, and tin-lead-copper alloys, and has a melting point no greater than 250° C.

7. A method as defined in claim 6, wherein said soft solder is a composition selected from the group consisting of:
 (a) 62% tin, 36% lead, and 2% silver;
 (b) 63% tin and 37% lead;
 (c) 96.5% tin and 3.5% silver; and
 (d) 60% tin, 38% lead and 2% copper.

8. A method as defined in claim 1, wherein said gold-tin intermediate layer is a eutectic composition comprising about 80% gold and about 20% tin.

9. A method as defined in claim 1 comprising the further steps of applying an organic based protective layer to said gold-tin intermediate layer before said step of joining a soft solder, such that said protective layer overlaps the edges of said intermediate layer to prevent the gold as well as the edges of said intermediate layer from alloying with said soft solder.

10. A method as defined in claim 9 wherein the gold member is mounted on a substrate and said protective layer is applied over the entire surface of the substrate.

11. A method as defined in claim 1 wherein the gold member is a layer mounted on a printed circuit board and acts as a conductor.

12. A method as defined in claim 11 wherein said soft solder serves to bond an electrical component to said gold layer via said intermediate layer.

13. A printed circuit unit comprising:
 (a) a board of insulating material;
 (b) at least one gold member mounted on said board;
 (c) an intermediate layer consisting of gold and tin coated over at least a portion of, and joined to, said gold member which functions to prevent the diffusion or alloying of the gold member into a subsequently applied soft solder; and
 (d) a body of soft solder coated onto, and joined to, said intermediate layer.

14. A printed circuit unit as defined in claim 13 further comprising an organic based protective layer which completely covers said board and overlaps the edges of said intermediate layer.

15. A printed circuit unit as defined in claim 13 wherein said soft solder is of a material selected from the group consisting of tin-lead, tin-silver, tin-lead-silver, and tin-lead-copper alloys; said soft solder having a melting point no greater than 250° C.

16. A printed circuit unit as defined in claim 15 wherein said soft solder is constituted by an alloy selected from the group consisting of:
 (a) 62% tin, 36% lead and 2% silver;
 (b) 63% tin and 37% lead;
 (c) 96.5% tin and 3.5% silver; and
 (d) 60% tin, 38% lead and 2% copper.

17. A printed circuit unit as defined in claim 15 wherein said intermediate layer is a eutectic composition consisting of about 80% gold and about 20% tin.

18. A printed circuit unit as defined in claim 13 wherein said soft solder is constituted by a gold-free composition.

19. A printed circuit unit as defined in claim 13 wherein said gold-tin intermediate layer is of a composition having a melting temperature higher than that of said soft solder.

20. A method for soldering a connecting lead of a component to a gold member, comprising: joining an intermediate layer consisting of gold and tin and having a first melting temperature to the surface of the gold member by melting the intermediate layer at a temperature at least equal to its melting temperature; permitting the intermediate layer to cool to a temperature below its melting temperature; and joining such connecting lead to the intermediate layer by contacting both the connecting lead and the intermediate layer with a soft solder having a second melting temperature lower than the first melting temperature, by melting the soft solder at a temperature at least equal to the second melting temperature and lower than the first melting temperature.

* * * * *